United States Patent [19]

Ganger

[11] Patent Number: 4,622,482
[45] Date of Patent: Nov. 11, 1986

[54] SLEW RATE LIMITED DRIVER CIRCUIT WHICH MINIMIZES CROSSOVER DISTORTION

[75] Inventor: Jeffrey D. Ganger, Austin, Tex.

[73] Assignee: Motorola, Inc., Schaumburg, Ill.

[21] Appl. No.: 771,526

[22] Filed: Aug. 30, 1985

[51] Int. Cl.⁴ .......................................... H03K 17/687
[52] U.S. Cl. .................................. 307/585; 307/263; 330/264
[58] Field of Search ............... 330/264; 307/262, 263, 307/304, 571, 585

[56] References Cited

U.S. PATENT DOCUMENTS 3,868,519  2/1975  Green ............................... 307/263

Primary Examiner—James B. Mullins
Attorney, Agent, or Firm—Anthony J. Sarli, Jr.; Jeffrey Van Myers; Robert L. King

[57] ABSTRACT

A driver circuit which provides an output voltage which is slew rate limited substantially independent of the value of any load which may be coupled thereto is provided. A pair of transistors of opposite conductivity type operate in push-pull fashion to drive the output voltage in response to a control signal. Capacitors are utilized to perform slew rate limiting. Additionally, each of the transistors is selectively dynamically biased to insure a substantially linear slew rate.

10 Claims, 1 Drawing Figure

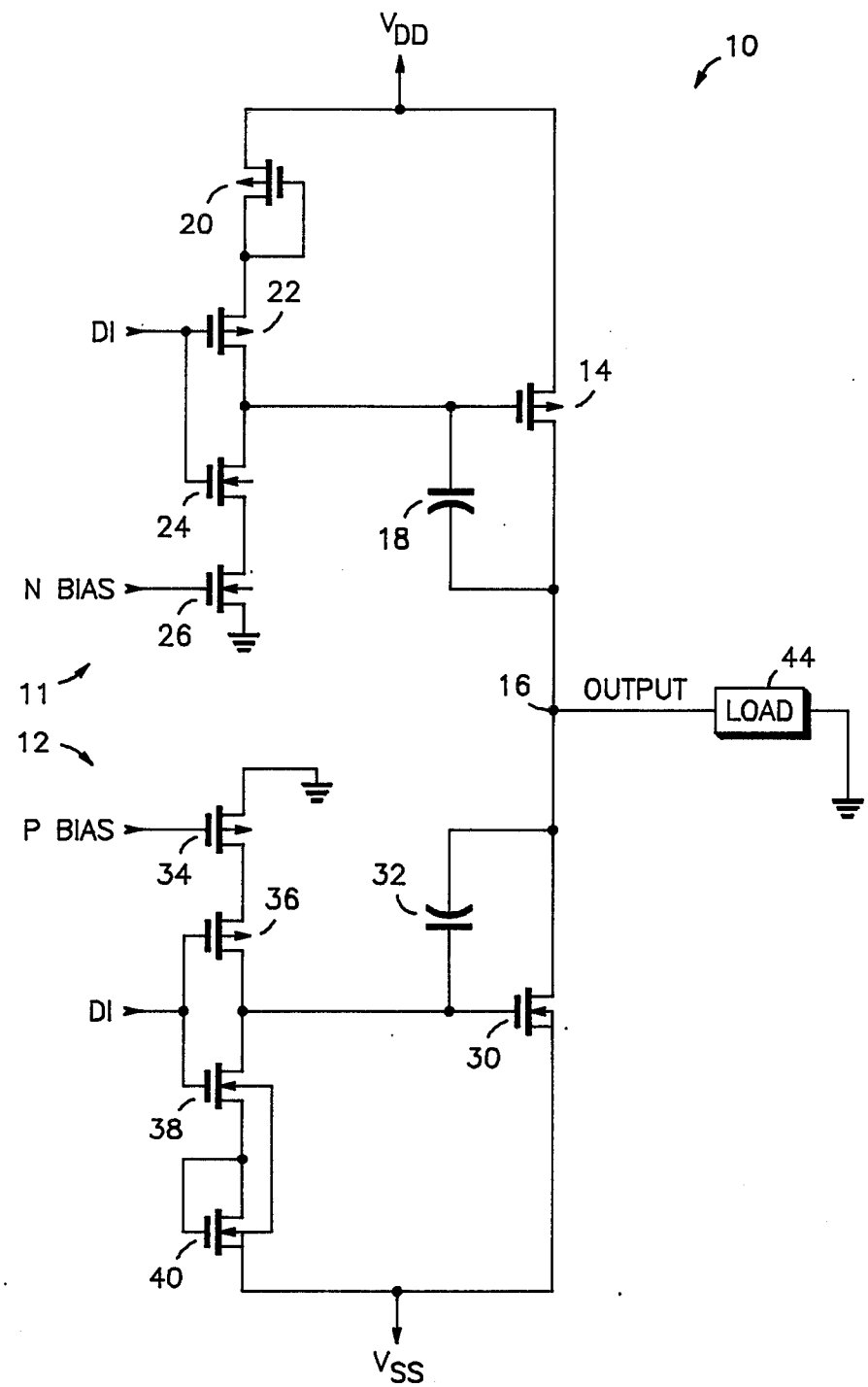

SLEW RATE LIMITED DRIVER CIRCUIT WHICH MINIMIZES CROSSOVER DISTORTION

TECHNICAL FIELD

This invention relates generally to telecommunication circuits, and more particularly, to telecommunication driver circuits which are slew rate limited.

BACKGROUND ART

The slew rate of a circuit is commonly defined as the maximum rate of change of the output voltage of an amplifier operated within its linear region or of a closed-loop amplifier under large-signal conditions which result in current limiting. A maximum amount of slew rate in amplifiers is typically desired so that the output voltage is as sensitive to input voltage changes as possible. However, in some telecommunication circuits which operate within conventional radio frequency (RF) ranges, the slew rate must be limited to avoid the output signal from interfering with associated RF equipment. Previous integrated circuit driver circuits which are slew rate limited have used a large valued external capacitor connected to an output terminal to capacitively limit the rate at which the output voltage signal may transition. Such slew rate limiting capacitors have to be large valued and are not easily integrable into a circuit because of size constraints.

BRIEF DESCRIPTION OF THE INVENTION

Accordingly, an object of the present invention is to provide an improved slew rate limited driver circuit.

Another object of the present invention is to provide an improved slew rate limited driver circuit which has no crossover distortion.

Yet another object of the present invention is to provide an improved slew rate limited driver circuit which is slew rate limited substantially independent of the value of a coupled load.

In carrying out the above and other objects of the present invention, there is provided, in one form, a circuit for providing an output signal having a predetermined amount of slew to a load coupled to an output terminal. A pair of transistors of opposite conductivity type are coupled between first and second power supply terminals. The transistors of the pair have the current conducting electrodes thereof coupled in series and each transistor has a current electrode coupled to the output terminal. First charge storage means are provided having a first electrode coupled to the output terminal, and a second electrode coupled to a control electrode of a first transistor of the pair. Second charge storage means are provided having a first electrode coupled to the output terminal, and a second electrode coupled to a control electrode of a second transistor of the pair. First switched impedance means are coupled to the second electrode of the first charge storage means, for selectively discharging the first charge storage means. Second switched impedance means are coupled to the second electrode of the first charge storage means, for selectively charging the first charge storage means. Third switched impedance means are coupled to the second electrode of the second charge storage means, for selectively discharging the second charge storage means. Fourth switched impedance means are coupled to the second charge storage means, for selectively charging the second charge storage means.

These and other objects, features and advantages will be more clearly understood from the following detailed description taken in conjunction with the accompanying drawing.

BRIEF DESCRIPTION OF THE DRAWING

The single FIGURE illustrates in schematic form a driver circuit in accordance with the present invention.

DETAILED DESCRIPTION OF THE INVENTION

Shown in the FIGURE is a driver circuit 10 having complementary first and second portions 11 and 12, respectively. It should be well understood that although specific N-channel and P-channel MOS devices are shown, driver circuit 10 may be implemented by completely reversing the processing techniques (e.g. N-channel to P-channel) or by using other types of transistors.

First portion 11 comprises a P-channel drive transistor 14 having a drain connected to a power supply terminal for receiving a positive power supply voltage, say $V_{DD}$. A source of transistor 14 is connected to an output terminal 16. A feedback coupling capacitor 18 has a first electrode connected to output terminal 16, and a second electrode connected to a gate of transistor 14. A diode configured P-channel transistor 20 has a source connected to power supply voltage $V_{DD}$, and both a gate and a drain connected together. A P-channel transistor 22 has a source connected to the drain of transistor 20, a gate coupled to a control signal labeled "DI", and a drain connected to the gate of transistor 14. An N-channel transistor 24 has a drain connected to the gate of transistor 14, a gate coupled to control signal DI, and a source connected to a drain of an N-channel transistor 26. A gate of transistor 26 is coupled to a constant bias voltage labeled "N BIAS". A source of transistor 26 is connected to a digital ground reference potential.

Portion 12 has an N-channel drive transistor 30 having a drain connected to output terminal 16, a gate, and a source connected to a second power supply voltage, say "$V_{SS}$". In the illustrated form, power supply voltage $V_{DD}$ is more positive than power supply voltage $V_{SS}$. Further, in a preferred form $V_{DD}$ and $V_{SS}$ are positive and negative voltages, respectively, which are substantially symmetrical with respect to the digital ground reference. A feedback coupling capacitor 32 has a first electrode connected to output terminal 16, and a second electrode connected to the gate of transistor 30. A P-channel transistor 34 has a source connected to the digital ground reference potential. It should be readily apparent that any voltage potential greater than $V_{SS}$ sufficient to drive transistor 30 up to and including $V_{DD}$ may be coupled to the source of transistor 34. A gate of transistor 34 is coupled to a constant bias voltage labeled "P BIAS". A drain of transistor 34 is connected to a source of a P-channel transistor 36. A gate of transistor 36 is coupled to control signal DI, and a drain of transistor 36 is connected to the gate of transistor 30. A drain of an N-channel transistor 38 is also connected to the gate of transistor 30. A gate of transistor 38 is also coupled to control signal DI. A source of transistor 38 is connected to both a gate and a drain of an N-channel transistor 40. A source of transistor 40 is connected to power supply voltage $V_{SS}$. In a preferred form, the substrates of both transistors 38 and 40 are connected together and to supply voltage $V_{SS}$ to minimize the conventional Body effect. A first terminal of an output resistive load 44 is connected to output terminal 16, and a second terminal of output load 44 is connected to the reference ground potential.

In operation, driver circuit 10 provides a linear slew rate limited output signal which varies between the $V_{SS}$ potential, a negative voltage, and the $V_{DD}$ potential, a positive voltage, in response to signal "DI" varying between low and high logic levels. The rate of change (i.e. slew) between $V_{SS}$ and $V_{DD}$ is controlled and limited as described below. The crossover point or point at which the output voltage transitions between negative and positive voltages is determined by the value of the digital reference potential which the second terminal of load 44 is connected to. For purposes of illustration only, assume that the crossover point is a digital ground potential of zero volts.

Initially, assume that signal DI is at a low logic level. Therefore, signal DI makes transistor 38 nonconductive and transistor 36 conductive. Therefore, transistors 34 and 36 function as switched impedance devices which charge capacitor 32 by coupling the reference ground potential to the gate of transistor 30. Further assume that the reference ground potential is also larger than the threshold voltage of transistor 30. Therefore, in response to a low logic level signal DI, transistor 30 couples $V_{SS}$ to output terminal 16. Simultaneously, signal DI makes transistor 22 conductive and transistor 24 nonconductive. Therefore, transistors 20 and 22 function as switched impedance devices to selectively charge capacitor 18 by coupling supply voltage $V_{DD}$ to the gate of transistor 14 which is made nonconductive. At this point in time, the first electrode of capacitor 18 is at approximately $V_{DD}$ minus a transistor threshold voltage drop, and the first electrode of capacitor 32 is at approximately the reference ground potential. The second electrodes of both capacitors 18 and 32 are at the same potential.

Assume now that signal DI transitions to a high logic level. Instantaneously, transistor 22 is nonconductive and transistor 26 is conductive. Transistors 24 and 26 couple digital ground to the gate of transistor 14 which makes transistor 14 conductive thereby coupling $V_{DD}$ to output terminal 16. Transistors 24 and 26 function as switched impedance devices to discharge capacitor 18. Simultaneously, transistor 36 is made nonconductive and transistor 38 is made conductive. A potential of substantially a threshold voltage drop above supply voltage $V_{SS}$ is coupled to the gate of transistor 30 via transistors 38 and 40 which begins to decouple supply voltage $V_{SS}$ from output terminal 16. Transistors 38 and 40 function as switched impedance devices to discharge capacitor 32. Once output terminal 16 is no longer strongly clamped to supply voltage potential $V_{SS}$, load 44 acts as a passive drive device to quickly drive output terminal 16 to the crossover reference digital ground. The abrupt drive of output terminal 16 to the reference digital ground creates a problem when attempting to limit the slew rate because load 44 drives output terminal 16 in a nonlinear and fast manner to the crossover point. The solution for providing a linear, controlled slew rate from $V_{SS}$ to digital ground is to keep transistor 30 conductive and functioning as a current source to $V_{SS}$ during this portion of the transition of the output voltage. In other words, transistor 30 is made to function as a linear variable load device with respect to output terminal 16 as driver transistor 14 functions to drive output terminal 16 to $V_{DD}$. Capacitor 18 functions to provide the primary slew rate limit of the output voltage as the voltage changes from $V_{SS}$ to $V_{DD}$. During the transition of the output voltage, the gate voltage of drive transistor 14 remains fairly constant because of the fixed gain between output terminal 16 and the gate of transistor 14 via coupling capacitor 18. The voltage at the gate of transistor 30 also remains fairly constant due to diode configured transistor 40. As configured, transistor 40 provides a square proportional increase in current in response to an increase in its gate-to-source voltage. The current flowing thru transistor 40 is also proportionately mirrored thru transistor 30 which tends to stabilize the bias on transistor 30. Capacitors 18 and 32 have ratioed capacitive values, and in a preferred form have substantially equal capacitive values. Assuming the voltage at the gates of transistors 14 and 30 initially remains fairly constant, the rate of change of voltage across capacitors 18 and 32 is approximately equal since both capacitors are connected to output terminal 16. Therefore, the currents thru capacitors 18 and 32, which are each defined as the product of the respective capacitance and the derivative of voltage stored thereon with respect to time, [C(dv/dt)], are substantially equal. The current thru transistor 26 may be established at a predetermined value by the amount of bias voltage applied to the gate of transistor 26. Therefore, this predetermined amount of current will also be conducted by transistor 40. Transistor 40 functions as a dynamic bias voltage source to selectively bias transistor 30. Since transistor 40 mirrors the current it is conducting to transistor 30 by an amplification factor set by the ratio of the sizes of transistors 30 and 40, the amount of current sourced by transistor 30 to $V_{SS}$ may be controlled until the output voltage reaches the digital ground potential. After the output voltage transitions thru the crossover point, coupling capacitor 18 continues to function with transistor 14 to linearly drive output terminal 16 to $V_{DD}$ at a controlled rate. After the voltage at output terminal 16 has reached a D.C. steady state value of $V_{DD}$ volts, transistor 30 becomes completely nonconductive as capacitor 32 blocks all bias voltage to transistor 30. Therefore, an output voltage with a very controllable and linear slew rate from $V_{SS}$ to $V_{DD}$ has been provided in response to signal DI transitioning from a low logic level of digital ground to substantially $V_{DD}$ volts.

Driver circuit 10 functions in a symmetrical and analagous manner when the output voltage transitions from $V_{DD}$ volts to $V_{SS}$ volts in response to a low logic level signal DI. Therefore, transistor 30 is now the drive transistor which is driving the output voltage to $V_{SS}$ volts, and transistor 14 functions as a linear current source to prevent the output voltage from immediately slewing to the digital reference voltage thru load 44. As previously described for transistor 30, the amount of current thru drive transistor 14 when functioning as a current source is substantially controlled by transistor 20 which functions as a dynamic bias voltage to selectively bias transistor 14 in response to signal DI. The output voltage at output terminal 16 linearly slews from $V_{DD}$ to the digital reference potential as a result of transistor 14 sourcing the current required to maintain the slew linear. Transistor 14 will source whatever current required to maintain the current thru capacitors 18 and 32 substantially equal. Thus, a linear slew rate from $V_{DD}$ to digital ground may be obtained regardless of the size or type of load. Transistor 30 linearly drives output terminal 16 to $V_{SS}$ at a rate determined substantially by capacitor 32. After the output voltage at output terminal 16 has further transitioned from the digital ground reference to $V_{SS}$, transistor 14 becomes nonconductive.

By now it should be apparent that a driver circuit which provides a controlled slew rate substantially independent of the size of a coupled load has been taught. Driver circuit 10 needs to have at least a predetermined minimum valued load impedance so that the current thru load 44 is not so large that circuit 10 cannot slew rate limit. Without sufficient load impedance coupled to node 16, current flowing thru transistor 30 which provides slew rate limiting has no practical effect in limiting the slew rate when transitioning from $V_{SS}$ to $V_{DD}$. The minimum resistive value of load 44 to maintain linear slew rate control is substantially equal to $(V_{SS}/I_{30})$ where $I_{30}$ equals the current which transistor 30 is capable of sinking or sourcing. Further, a practical limitation of the size of $I_{30}$ also exists due to a maximum amount of power dissipation associated with the current which transistor 30 may sink. However, the range of slew rate can be easily adjusted to allow the driver circuit to meet conventional EIA Standard No. RS-232-C and CCITT V.28 standards. There is no limit on the maximum resistive size of load which may be used in association with the present invention.

While an embodiment has been disclosed using certain assumed parameters, it should be understood that certain obvious modifications to the circuit or the given parameters will become apparent to those skilled in the art, and the scope of the invention should be limited only by the scope of the claims appended hereto.

I claim:

1. A slew rate limited driver circuit for providing an output signal having a predetermined amount of slew to a load coupled to an output terminal, comprising:
   a pair of transistors of opposite conductivity type coupled between first and second power supply terminals and having the current conducting paths thereof coupled in series, each transistor of the pair having a current electrode coupled to the output terminal, and a control electrode;
   first charge storage means having a first electrode coupled to the output terminal, and a second electrode coupled to the control electrode of a first transistor of the pair of transistors;
   second charge storage means having a first electrode coupled to the output terminal, and a second electrode coupled to the control electrode of a second transistor of the pair of transistors;
   first switched impedance means coupled to the second electrode of the first charge storage means, for selectively discharging the first charge storage means;
   second switched impedance means coupled to the second electrode of the first charge storage means, for selectively charging the first charge storage means;
   third switched impedance means coupled to the second electrode of the second charge storage means, for selectively discharging the second charge storage means; and
   fourth switched impedance means coupled to the second charge storage means, for selectively charging the second charge storage means.

2. The driver circuit of claim 1 wherein the first charge storage means are selectively charged at a first predetermined rate and discharged at a second predetermined rate.

3. The driver circuit of claim 1 wherein the second charge storage means are selectively charged at a first predetermined rate and discharged at a second predetermined rate.

4. The driver circuit of claim 1 wherein said second switched impedance means further comprise:
   a third transistor having a first current electrode coupled to the first power supply terminal, and both a control electrode and a second current electrode connected together; and
   a fourth transistor having a first current electrode coupled to the second current electrode of the third transistor, a control electrode adapted to receive a control signal, and a second current electrode coupled to the second electrode of the first charge storage means.

5. The driver circuit of claim 4 wherein said third switched impedance means further comprise:
   a fifth transistor having a first current electrode coupled to the second power supply terminal, and both a control electrode and a second current electrode connected together; and
   a sixth transistor having a first current electrode coupled to the second current electrode of the fifth transistor, a control electrode adapted to receive the control signal, and a second current electrode coupled to the second electrode of the second charge storage means.

6. The driver circuit of claim 1 wherein said first switched impedance means further comprise:
   a third transistor having a first current electrode coupled to the second electrode of the first charge storage means, a control electrode adapted to receive the control signal, and a second current electrode; and
   a fourth transistor having a first current electrode coupled to the second current electrode of the third transistor, a control electrode adapted to receive a first bias voltage, and a second current electrode coupled to a reference voltage terminal.

7. The driver circuit of claim 1 wherein said fourth switched impedance means further comprise:
   a fifth transistor having a first current electrode coupled to the second electrode of the second charge storage means, a control electrode adapted to receive the control signal, and a second current electrode; and
   a sixth transistor having a first current electrode coupled to the second current electrode of the fifth transistor, a control electrode adapted to receive a second bias votlage, and a second current electrode coupled to the reference voltage terminal.

8. A method of slew rate limiting a driver circuit to provide an output signal to a load coupled to an output terminal thereof, said output signal having a predetermined amount of slew rate, comprising the steps of:
   coupling current conducting electrodes of a pair of driver transistors of complementary conductivity type in series between first and second power supply terminals, wherein the output terminal is between the driver transistors;
   referencing the load to a predetermined reference potential having a value between first and second power supply voltages; and
   coupling a first electrode of each of first and second capactiros to the output terminal and selectively coupling a second electrode of each of said capacitors via switched impedance means to a predetermined one of the first or second power supply voltages or to the reference potential, for respectively slew rate limiting the output voltage for positive and negative transitioning output signals.

9. A slew rate limited driver circuit, comprising:
a first transistor of a first conductivity type having a first current electrode coupled to a first terminal adapted to receive a first power supply voltage, a control electrode, and a second current electrode coupled to an output terminal;
a first capacitor having a first electrode coupled to the output terminal, and a second electrode coupled to the control electrode of the first transistor;
a second transistor of the first conductivity type having a first current electrode coupled to the first terminal, and both a control electrode and a second current electrode connected together;
a third transistor of the first conductivity type having a first current electrode coupled to the second current electrode of the second transistor, a control electrode adapted to receive a control signal, and a second current electrode coupled to the control electrode of the first transistor;
a fourth transistor of a second conductivity type having a first current electrode coupled to the second current electrode of the fourth transistor, a control electrode adapted to receive a first bias voltage, and a second current electrode coupled to a reference voltage terminal;
a fifth transistor of the second conductivity type having a first current electrode coupled to the second current electrode of the fourth transistor, a control electrode adapted to receive a first bias voltage, and a seconde current electorde coupled to a reference voltage terminal;
a sixth transistor of the second conductivity type having a first current electrode coupled to the output terminal, a second current electrode coupled to a second terminal adapted to receive a second power supply voltage, and a control electrode;
a second capacitor having a first electrode coupled to the output terminal, and a second electrode;
a seventh transistor of the first conductivity type having a first current electrode coupled to the reference voltage terminal, a control electrode adapted to receive a second bias voltage, and a second current electrode;
an eighth transistor of the first conductivity type having a first current electrode coupled to the second current electrode of the seventh transistor, a control electrode adapted to receive the control voltage, and a second current electrode coupled to the second celectrode of the second capacitor;
a ninth transistor of the second conductivity type having a first current electrode coupled to the control electrode of the sixth transistor, a control electrode adapted to receive the control signal, and a second current electrode; and
a tenth transistor of the second conductivity type having both a first current electrode and a control electrode connected together and coupled to the second current electrode of the ninth transistor, and a second current electrode coupled to the second terminal.

10. The slew rate limited driver circuit of claim 9 wherein the first conductivity type is an N-type and the second conductivity type is a P-type.

* * * * *